United States Patent [19]

Steigerwald et al.

[11] 4,248,921

[45] Feb. 3, 1981

[54] METHOD FOR THE PRODUCTION OF ELECTRICALLY CONDUCTIVE AND SOLDERABLE STRUCTURES AND RESULTING ARTICLES

[76] Inventors: Wolf-Erhard Steigerwald, Rua de Fez, 731, 4000 Porto, Portugal; Peter Ambros, Jahnstrasse 6, 8741 Hohenroth; Erich Gatzke, Sonnenlandstrasse 8, 8740 Bad Neustadt, Saale, both of Fed. Rep. of Germany

[21] Appl. No.: 918,378

[22] Filed: Jun. 23, 1978

[30] Foreign Application Priority Data

Jun. 24, 1977 [DE] Fed. Rep. of Germany ....... 2728465

[51] Int. Cl.³ .................... B05D 5/12; B32B 5/16
[52] U.S. Cl. .................... 428/148; 427/123; 427/304; 427/405; 428/328; 428/551; 428/555; 428/560; 427/443.1
[58] Field of Search ............... 427/123, 203, 404, 202, 427/205, 405, 306, 307, 430 A, 431, 304, 433; 428/141, 142, 148, 328, 329, 330, 549, 551, 552–561

[56] References Cited

U.S. PATENT DOCUMENTS

| | | | |
|---|---|---|---|
| 2,748,701 | 6/1956 | Barrows | 428/148 |
| 3,014,818 | 12/1961 | Campbell | 428/560 |
| 3,031,344 | 4/1962 | Sher et al. | 428/560 |
| 3,245,833 | 4/1966 | Trevoy | 428/328 |
| 3,488,166 | 1/1970 | Kovac et al. | 427/430 A |
| 3,546,011 | 12/1970 | Knorre et al. | 427/307 |
| 3,847,649 | 11/1974 | Sova | 428/458 |
| 4,059,710 | 11/1977 | Nishiyama et al. | 427/430 A |
| 4,113,899 | 9/1978 | Henry et al. | 427/203 |
| 4,150,177 | 4/1979 | Guditz et al. | 427/430 A |

*Primary Examiner*—William J. Van Balen
*Attorney, Agent, or Firm*—Wigman & Cohen

[57] ABSTRACT

Method for producing an electrically conductive and solderable structure along with the resulting article are disclosed. The method comprises admixing metal particles, metal salts and an organic polymer binder as a paste which is applied to a non-conductive substrate by printing or the like. The paste is heated to permit metal salts to migrate to the surface of the binder where they become concentrated. During metallizing the salts are removed by the bath and metal is deposited in pores formed in the binder by the dissolved salts. The metal layer is adherent to the binder and provides good solderable points.

22 Claims, 2 Drawing Figures

AFTER METALLIZATION

Cu LAYER

ELECTRICALLY CONDUCTIVE LAYER

SUBSTRATUM

BEFORE METALLIZATION

AFTER METALLIZATION

METHOD FOR THE PRODUCTION OF ELECTRICALLY CONDUCTIVE AND SOLDERABLE STRUCTURES AND RESULTING ARTICLES

BACKGROUND OF THE INVENTION

The invention relates to a method for the production of electrically conductive and solderable structures generally secured to a non-conductive substrate along with the resulting article.

A number of methods for the production of printed circuit boards are already known in which dispersions of organic polymers having a metal particle component, preferably silver particles, are deposited onto a non-conductive substrate, such as, hard paper or aluminum oxide, by spraying, drawing or screen printing processes. The coated substrate is cured by a subsequent thermal treatment. Electrical structures of this nature, which contain highly cross-linked and therefore thermosetting polymers, such as, epoxides or polyphenols as binding agents, are also distinguished by a good adhesiveness with regard to the metal particles dispersed therein. The problem with electrical structures of this type, however, resides with the electrical contacts which are not solderable.

One known method for the production of printed circuits utilizes a heat hardenable or heat-deformable plastic as the substrate material for the conductive component. This substrate is a mixture of insulating material and minute copper oxide particles on its outer surface, i.e., on the portions of the outer surface which are to be provided with conductive paths. The particles become rigidly connected with the insulating material during curing. The copper oxide particles on the surface are hereafter reduced to copper by sulphuric acid, phosphoric acid, etc. The surface is then rinsed and placed in an electroless bath in which copper or another suitable metal is built-up. The weight ratio of the copper oxide particles fluctuates between 0.25 and 80%. If the copper oxide content is near the lower value, it may be necessary to mechanically brush or scrape the surface in order to expose the particles near the surface to acid treatment. Without this additional preliminary handling the separation would require several hours. The acid treated substrate must immediately be additionally processed to avoid oxidation of the metallic copper which is exposed to the atmosphere. In electrical structures of this type the electrical capacity is determined exclusively by the thickness of the copper layer. To maintain good conductivity, the copper layer thickness must be relatively large. Building a relatively large copper layer from an electroless or currentless coppering bath, however, is a time consuming process even without the aforementioned additional preliminary handling. Another disadvantage of the known process resides in the fact that the adhesiveness of an electroless deposited copper layer generally decreases with increasing layer thickness, resulting in decreased reliability at a soldering point.

OBJECTS AND SUMMARY OF THE INVENTION

It is therefor an object of the present invention to avoid the disadvantages of the known techniques and to provide a simple process for the production of improved electrically conductive and simultaneously solderable structures. Another object of the present invention is to provide an electrically conductive structure, as aforementioned wherein the conductivity is not exclusively determined by the metal layer deposited from an electroless metalization bath, but in which a suitable adherent metal layer is provided to achieve highly reliable individual soldering locations.

These and other objects are achieved according to the present invention by providing an electrically conductive structure formed by applying a curable paste in desired patterns onto a non-conductive substrate and thereafter curing the paste. The paste comprises an organic polymer which includes minute particles which effect the electrical conductivity of the structure and also metal salts and/or substances which form metal salts in dilute acids (hereinafter "metal salts"). The metal salts are enriched on the outer surface of the structure by wetting or flotation agents for reasons noted hereinafter and are soluble in galvanic or autocatalytically operating metallization baths.

The organic polymer is also provided with a metallic layer formed by galvanic or autocatalytic deposition at the locations provided for solder connections. The metallic layer is firmly connected with the underlying conductive structure due to the provision of cavern-like pores formed in the surface of the conductive structure by dissolving the metal salts located in the surface of the conductive structure.

In one advantageous embodiment of the present invention the electrically conductive structures are secured to the substrate by means of crevices or openings arranged in the substrate for receiving the penetrating material therein. The conductive structure can be directed into the substrate openings by sucking the paste therethrough using negative pressure.

Where all or portions of the conductive structures are not provided with the metal layer, such portions can be covered with a solder sealing lacquer.

In a further embodiment of the present invention the electrically conductive structures are located on both sides of a non-conductive substrate and are electrically connected with each other by means of crevices or openings arranged in the substrate. These openings are completely or partially filled with the electrically conductive structure material. Again, as before, all or portions of the conductive structure surface which are not to be covered with a metal layer, can be covered with a solder sealing lacquer.

The electrically conductive structures of the present invention may also be arranged in sandwich-like fashion in several planes separated by insulating layers, and electrically connected with each other through openings in the insulating layer. The uppermost layer of the electrically conductive structure may be provided with a metal layer or with a solder sealing lacquer, as aforementioned.

The organic polymer binder employed is advantageously a caprolactam-blocked adduct of the isophorondiisocyanate and an oxyester of the hydroxyl group. The organic polymer can also be a mixture of caprolactam-blocked polyurethane with silicone resins and/or acetal resins and/or vinyl chloride-vinylacetatecopolymers. Examples of such polymers are those sold by Bayer under the trademark Baysilon-Harz P 150 K and products sold by Wacker under the tradename Siliconharzlösung RE and Vinnol E 15/45 M.

The minute particles employed which effect the electrical conductivity of the structure are advantageously metal particles, such as, silver, gold, nickel, metals of the platinum group, silver or gold coated copper or mixtures thereof. The metal particles can be of platelet-like or microcrystalline form or a mixture thereof.

To alter the specific conductivity of the electrically conductive structure, the weight ratio of the metal particles can be suitably varied with respect to the organic polymer. A preferred weight ratio of about 1:1 to 6:1, or more, may be used.

The metal salts incorporated in the organic polymer, in addition to the metal particles, are desirably copper (II) sulfate, copper (I) chloride, copper (II) formiate, copper (II) acetate, sodium chloride, sodium sulfite, lithium chloride, sodium carbonate, silver chloride, silver sulfate, silver nitrate and/or mixtures thereof. The concentration of metal salts present in the organic polymer paste is generally up to about 30% by weight of the metal particles. A preferred concentration ranges from about 10% to about 20%.

A non-ionic or anionic active wetting agent in amounts up to about 3% can be utilized to effect concentration of the metal salts at or near the surface of the cured organic polymer. The flotation agent employed can be Byk O (a tradename of Byk-Mallinckrodt).

The paste produced according to the process can be spread on the non-conductive substrate by conventional techiques, e.g., spraying, troweling, printing. Screen printing is preferred.

The galvanic or autocatalytic deposited metal layer can be silver, copper or tin. If the metal layer is copper, it can be additionally covered with a second relatively thin metal layer made of a noble metal.

Hard paper, temperature-resistant plastic, ceramic material or metals having a non-conductive surface can be utilized as the non-conductive substrate according to the present invention. The non-conductive substrate can also be flexible.

The electrically conductive and solderable structures according to this invention are made by forming a paste composition comprising a mixture of microcrystalline and platelet-like metal, e.g., silver particles, a water-soluble metal salt e.g., copper sulfate, a reducing agent, e.g., sulfite compound and a non-ionic active wetting agent, dispersed in a polymer binder, e.g., caprolactam-blocked polyurethane with silicone resins and/or acetal resins and/or vinyl chloride-vinylacetatecopolymerisates. The thus-obtained paste is applied to a hard paper substrate by screen printing thereon predetermined conductive paths or surface patterns. The composite is thereafter cured at a temperature of about 175°-230° C.

The polymer binding agent is thermoplastic at the curing temperature. In the softened state and before cross-linking is effected metal salt particles are carried to the surface of the polymer and become concentrated. The metal salt particles located at or near the surface of the binding agent are about 5 μm which, when exposed to the subsequent metallizing bath are dissolved therein. In this manner a large number of closely spaced microscopic caverns or pores are provided over the entire surface of the binding agent. The inner surfaces of these caverns are activated for receiving the deposited copper layer or the like and the initiator effect for subsequent metal deposition is attained.

The metal salt component which is dissolved in the metallizing bath has no disruptive effect on the stability of the bath and simplifies the optimal bath control. The cavern-like pores produced yields an optimal anchoring of the metal layer which is deposited in the caverns and additionally covers the conductive paths or surface patterns of the surface of the binding agent.

It has been determined that the presence of a reducing salt, e.g., (sodium sulfite, sodium hydrogen sulfite,) improves the conductivity of the thus-obtained structure and accelerates the metal, e.g., copper layer deposition from the metallizing bath.

The thus-obtained copper coating does not serve primarily to produce the electrical conductivity of the conductive paths, but rather is primarily used to obtain trouble-free solderability of the electrical structure. It will be appreciated that since the actual electrical conductivity of the conductive paths or surface patterns is determined by the metal particles dispersed in the binding agent, the deposited metal layer can be held relatively thin. Thus, the deposition time for providing a thin copper layer is relatively fast and the resulting layer is sufficient to provide good solderability.

A further advantage of the present invention resides in the fact that the activation step under acid conditions do not require subsequent neutralization and washing steps.

Because the electrical structure or circuit is itself already electrically conductive, to achieve solderable contact points the electrical circuit can be masked with a known solder sealing lacquer before deposition of the metal layer in a manner such that only the points provided for contacts are metallized and thereby made solderable. In this manner the quantity of metal required is substantially reduced, thereby further simplifying the process, assuring trouble-free bath control, and improving the economy of the process.

Having described the invention in general terms the following examples are provided to more fully illustrate the invention. These examples are not meant to be limiting.

| Paste Ingredients | Broad Range (WT %) | Preferred Range (Wt %) |
| --- | --- | --- |
| Binder | 12 to 40 | 18 to 25 |
| Metal Salts | 5 to 20 | 6 to 12 |
| Metal particles | 40 to 70 | 55 to 65 |
| Reducing agent | 0 to 20 | 6 to 12 |
| Wetting agent | 0 to 3 | 0,5 to 1 |

Mixed by hand or with a mixer
Way of application: i.e. silk-screening
Hardening: starting with 180° C.

DETAILED DESCRIPTION OF A PREFERRED EMBODIMENT

Figure 1:
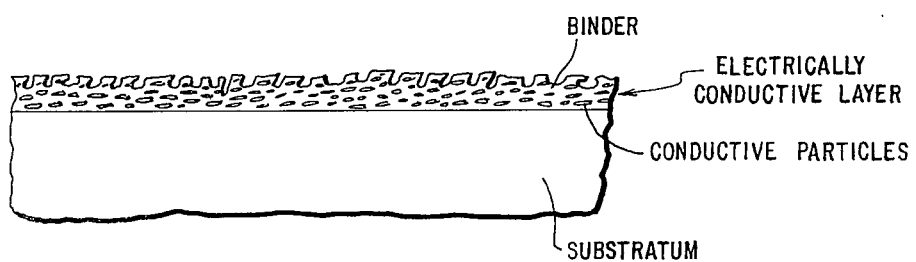
FIG. 1 is a fragmentary sectional view of the structure of the present invention before metallization.
Figure 2:
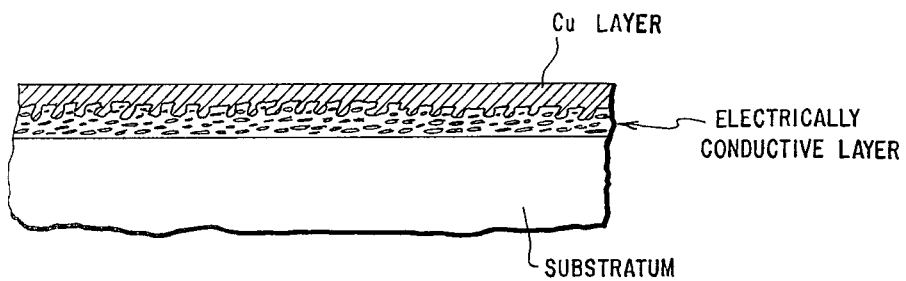
FIG. 2 is a fragmentary sectional view of the structure of the present invention after metallization.

FIGS. 1 and 2 are fragmentary sectional views illustrating the electrical conductive and solderable structures of the present invention prior to metallization (FIG. 1) and subsequent thereto (FIG. 2). The cavern-like pores which are produced on the surface provides optimal anchoring of the desposited copper thereon.

What is claimed is:

1. Method for the production of electrically conductive and solderable structures located in selected surface patterns on a non-conductive substrate, comprising the steps of applying at least one side of said non-conductive substrate a paste, comprising an organic polymer binder admixed with metal particles for providing electrical conductivity to the structure, metal salt particles, and a wetting agent in an amount which is effective for floating the metal salt particles to the surface of the structure, heating said paste and concentrating the metal salt particles at the exposed surface of the binder before it is cured, forming cavern-like pores on the surfaces of the cured binder by dissolving the metal salt particles thereon in a metallizing bath to obtain the cavern-like pores, and depositing a metal layer by galvanic or autocatalytic separation onto the porous surface to firmly connect the deposited layer with the underlying conductive structure.

2. The method according to claim 1, wherein the electrically-conductive structures are located on the inner surfaces of openings arranged in the substrate.

3. The method according to claim 1, in that the electrically-conductive structures are located on both sides of a non-conductive substrate and are in electrical communication with each other by means of openings arranged in the substrate, which are completely or partially filled with the material which forms the electrically conductive structures.

4. The method according to claim 1, wherein the electrically conductive structures are arranged in sandwich-like fashion in several planes separated by insulating layers, and are electrically connected with each other via open regions of the insulating layer.

5. The method according to claim 1 wherein the organic polymer binder is a system based on a caprolactam-blocked adduct of isophorondiisocyanate and an oxyester of the hydroxyl group.

6. The method according to claim 1 wherein the organic polymer is a mixture of caprolactam-blocked polyurethane with silicone resins and/or acetal resins and/or vinyl chloride-vinylacetate-copolymerisates.

7. The method according to claim 1 wherein the particles effecting the electrical conductivity of the structure are metal particles of silver, gold, nickel, particles from the platinum group metals, silver or gold coated copper particles or mixtures thereof.

8. The method according to claim 7 wherein the metal particles are formed as platelets or microscopic crystals and mixtures thereof.

9. The method according to claim 7, wherein the weight ratio of the metal particles to the organic polymer is at least about 1:1 to 6:1.

10. The method according to claim 1, wherein the metal salts admixed with the organic polymer binder is selected from the group consisting of copper (II) sulfate, copper (I) chloride, copper (II) formiate, copper (II) acetate, sodium chloride, sodium sulfite, lithium chloride, sodium carbonate, silver chloride, silver sulfate, silver nitrate and mixtures thereof.

11. The method according to claim 1 wherein the metal salts comprise up to about 30% by weight of the particles effecting the electrical conductivity.

12. The method according to claim 1, wherein the wetting agent which effects the floating effect of the metal salts is a non-ionic or anionic active wetting agent.

13. The method according to claim 12, wherein the wetting agent is added to the organic polymer in an amount up to 3% by weight.

14. The method according to claim 1, wherein the paste is applied to the non-conductive substrate by screen printing.

15. The method according to claim 1, wherein the galvanic or autocatalytically deposited metal layer is taken from the group consisting of silver, copper or tin.

16. The method according to claim 1 wherein the deposited metal layer is copper which is covered with a second metal layer.

17. The method according to claim 1, wherein the non-conductive substrate is hard paper, temperature resistant plastic, ceramic material or a metallic material having non-conductive outer coating.

18. The method according to claim 1, wherein the non-conductive substrate is flexible.

19. The method according to claim 10 wherein the metal salts comprise up to about 30% by weight of the particles effecting the electrical conductivity.

20. The method according to claim 15 wherein said metal layer is covered with a second metal layer of a noble metal.

21. The method according to claim 16 wherein said metal layer is covered with a second metal layer of noble metal.

22. A printed circuit board structure made in accordance with claim 1.

* * * * *

UNITED STATES PATENT AND TRADEMARK OFFICE
CERTIFICATE OF CORRECTION

PATENT NO. : 4,248,921

DATED : Feb. 3, 1981

INVENTOR(S) : Steigerwald et al

It is certified that error appears in the above-identified patent and that said Letters Patent are hereby corrected as shown below:

Claim 1, line 4, after "applying" insert --to--.

Signed and Sealed this

Twenty-third Day of June 1981

[SEAL]

Attest:

RENE D. TEGTMEYER

Attesting Officer

Acting Commissioner of Patents and Trademarks